United States Patent
Yamamoto et al.

(10) Patent No.: US 8,555,808 B2
(45) Date of Patent: Oct. 15, 2013

(54) SUBSTRATE PROCESSING APPARATUS

(75) Inventors: Tetsuo Yamamoto, Toyama (JP);
Tadashi Kontani, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 1237 days.

(21) Appl. No.: 12/086,632

(22) PCT Filed: Apr. 24, 2007

(86) PCT No.: PCT/JP2007/058828
§ 371 (c)(1),
(2), (4) Date: Dec. 16, 2008

(87) PCT Pub. No.: WO2007/129568
PCT Pub. Date: Nov. 15, 2007

(65) Prior Publication Data
US 2009/0255468 A1    Oct. 15, 2009

(30) Foreign Application Priority Data
May 1, 2006    (JP) .................................. 2006-127869

(51) Int. Cl.
*C23C 16/00*    (2006.01)

(52) U.S. Cl.
USPC .................................................... 118/723 E

(58) Field of Classification Search
USPC ....... 118/723 E; 156/345.43, 345.44, 345.45, 156/345.46, 345.47
See application file for complete search history.

(56) References Cited

U.S. PATENT DOCUMENTS

| | | | |
|---|---|---|---|
| 5,383,984 A * | 1/1995 | Shimada et al. | 156/345.26 |
| 2003/0164143 A1* | 9/2003 | Toyoda et al. | 118/723 E |
| 2004/0020432 A1 | 2/2004 | Takagi et al. | |
| 2004/0025786 A1* | 2/2004 | Kontani et al. | 118/715 |
| 2008/0153308 A1* | 6/2008 | Ogawa et al. | 438/758 |
| 2008/0153309 A1 | 6/2008 | Sakai et al. | |

FOREIGN PATENT DOCUMENTS

| | | |
|---|---|---|
| JP | 62-245626 A | 10/1987 |
| JP | 2004-55446 A | 2/2004 |
| JP | 2004-124234 A | 4/2004 |
| KR | 10-0674467 B1 | 1/2007 |
| KR | 10-0829327 B1 | 5/2008 |
| WO | WO-01/88221 A1 | 11/2001 |
| WO | WO 2005083766 A1 * | 9/2005 |

* cited by examiner

*Primary Examiner* — Sylvia R MacArthur
*Assistant Examiner* — Anna Crowell
(74) *Attorney, Agent, or Firm* — Birch, Stewart, Kolasch & Birch, LLP.

(57) ABSTRACT

Disclosed is a substrate processing apparatus, including: a processing chamber to accommodate a plurality of substrates therein in such a way that the substrate are vertically stacked; a gas supply system to supply processing gas into the processing chamber; an exhaust system to exhaust an atmosphere from the processing chamber; at least a pair of electrodes made of flexible member extending in a stacking direction of the substrates to activate the processing gas; and protecting tubes to accommodate the electrodes therein, wherein each of the protecting tubes is provided with a bent portion at a higher position than an uppermost substrate, and a tip end of each of the electrodes is located on a tip end side of each of the protecting tubes over the bent portion.

16 Claims, 14 Drawing Sheets

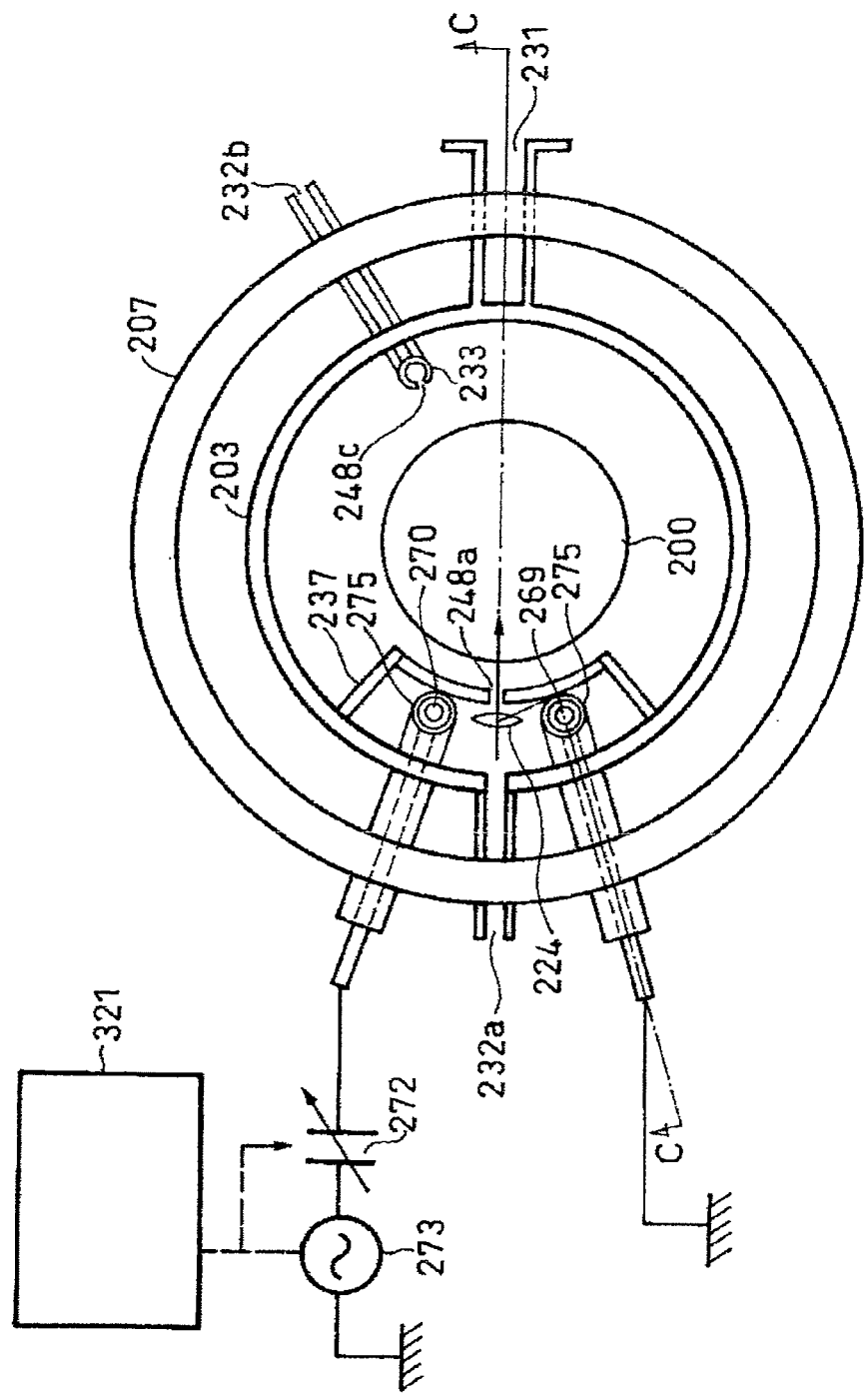
FIG. 10 "CONVENTIONAL ART"

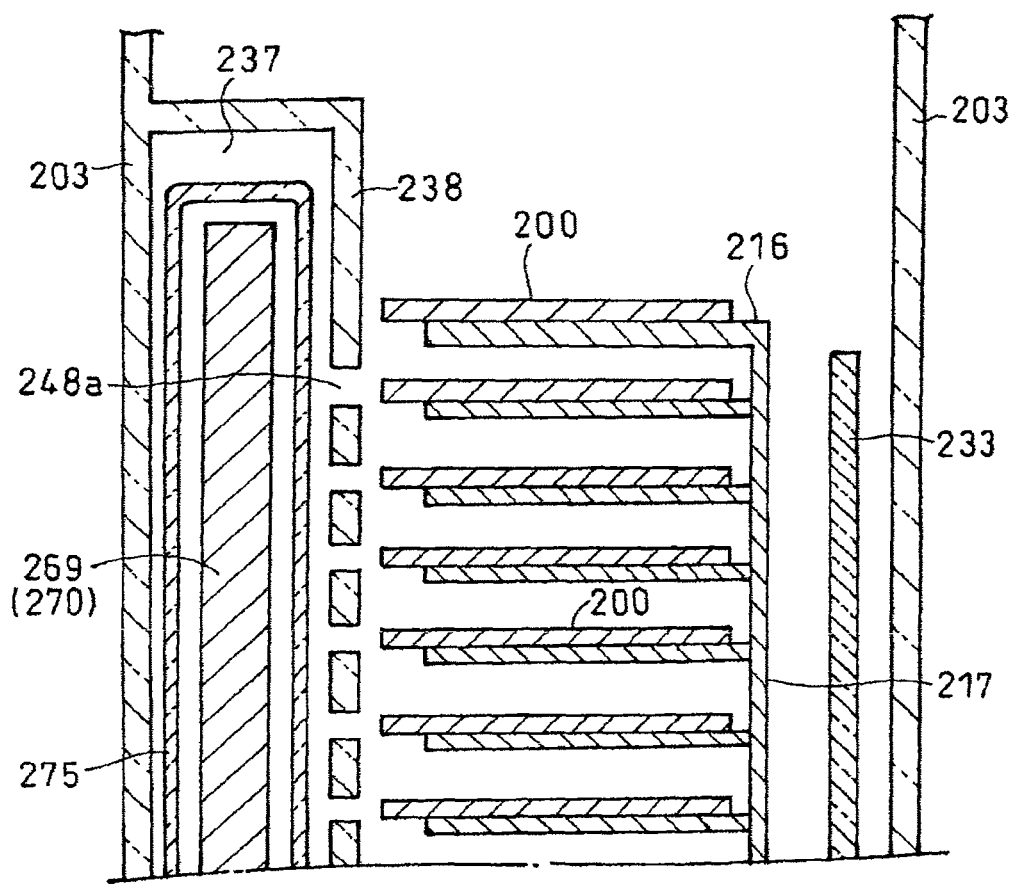
FIG.11 "CONVENTIONAL ART"

FIG.12 "CONVENTIONAL ART"
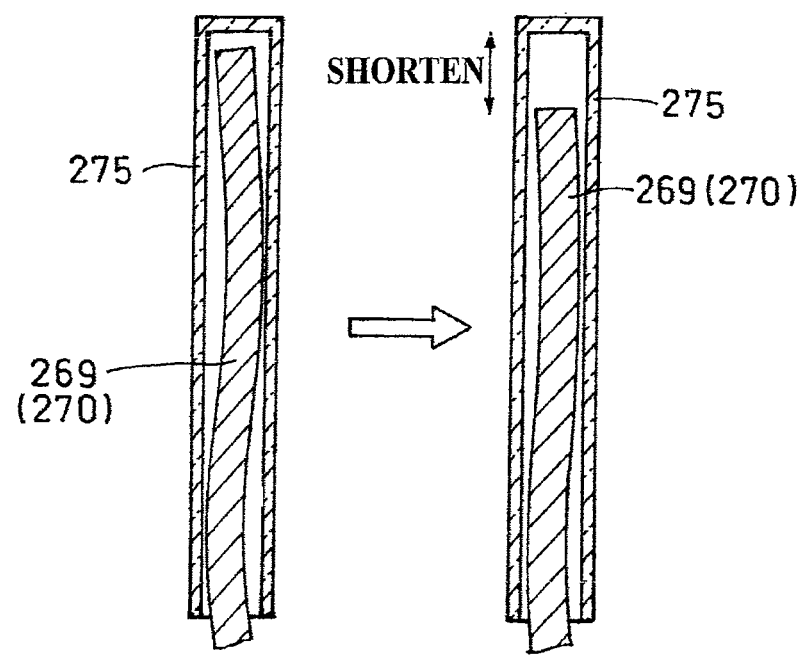

FIG.13 "CONVENTIONAL ART"
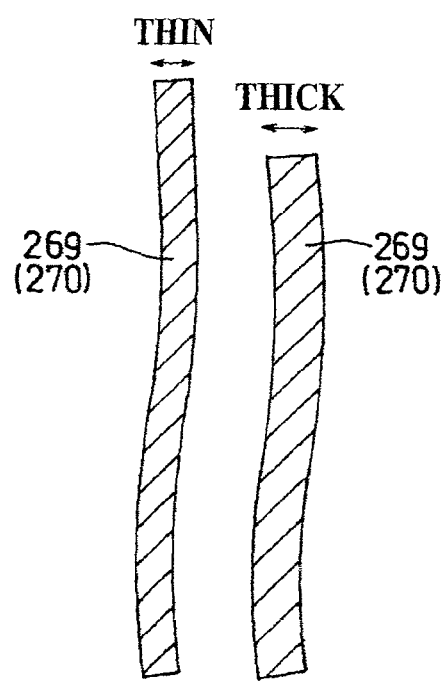

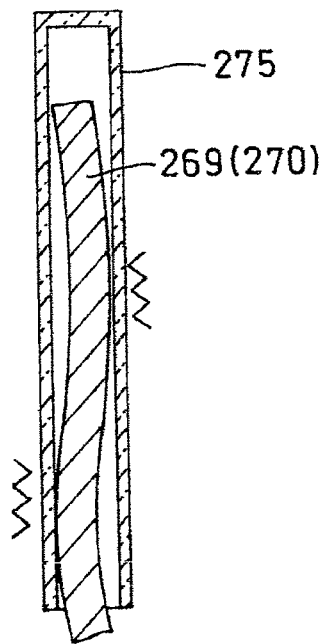
FIG.14 "CONVENTIONAL ART"

SUBSTRATE PROCESSING APPARATUS

BACKGROUND OF THE INVENTION

1. Field of the Invention

The present invention relates to a substrate processing apparatus, and more particularly, to a substrate processing apparatus which forms a film on a semiconductor wafer utilizing plasma-excited processing gas.

2. Description of the Related Art

FIG. 10 is a schematic transverse sectional view for explaining a vertical type substrate processing furnace of a conventional substrate processing apparatus. A vertical sectional view taken along the line C-C in FIG. 10 corresponds to a vertical sectional view in FIG. 2. FIG. 11 is an enlarged vertical sectional view taken along the line C-C in FIG. 10.

Some substrate processing apparatuses which form a film on a semiconductor wafer utilizing plasma-excited processing gas have a structure that electrodes 269 and 270 for generating plasma are accommodated in electrode protecting tubes 275 in order to prevent a reaction with the processing gas.

Each of the electrode protecting tubes 275 is bent in the middle and a lower end inclined portion thereof projects outward from a side wall of a processing tube 203.

If a flexible member, e.g., a member having a knitted structure (braided structure) is used for the electrode 269 and the electrode 270, the electrodes 269 and 270 can be inserted into the electrode protecting tubes 275 from the lower end inclined portions of the electrode protecting tubes 275, and the electrodes 269 and 270 can reach upper ends of the electrode protecting tubes 275 (see a patent document 1).

Patent Document 1; Japanese Patent Application No. 2004-55446

If a knitted structure is employed for the flexible electrodes 269 and 270, the electrodes may become shorter than their original length because of their own weight and a decrease in elasticity due to the heat or long term use as shown in FIG. 12.

Moreover, as shown in FIG. 13, since the length is different from one individual to another because a member having a knitted structure is extensible, i.e. the member under tension increases in length, it is difficult to define the length.

The entire length may become shorter due to friction with the electrode protecting tube 275 as shown in FIG. 14.

Upper ends of the electrodes 269 and 270 are located higher than an uppermost wafer 200. If the length of the electrodes 269 and 270 is shortened, a plasma state (density and the like) at an upper portion in the furnace is different from a plasma state at the other portion. As a result, a thickness of a film formed on a wafer 200 located at the upper portion in the furnace is reduced, uniformity among the wafers is deteriorated, and a film forming result is deteriorated.

SUMMARY OF THE INVENTION

It is, therefore, a main object of the present invention to provide a substrate processing apparatus having electrodes which extend in a stacking direction of vertically stacked substrates and which are made of flexible member, the substrate processing apparatus being capable of reducing vertical deformation of the electrodes.

According to one aspect of the present invention, there is provided a substrate processing apparatus, including: a processing chamber to accommodate a plurality of substrates therein in such a way that the substrate are vertically stacked; a gas supply system to supply processing gas into the processing chamber; an exhaust system to exhaust an atmosphere from the processing chamber; at least a pair of electrodes made of flexible member extending in a stacking direction of the substrates to activate the processing gas; and protecting tubes to accommodate the electrodes therein, wherein each of the protecting tubes is provided with a bent portion at a higher position than an uppermost substrate, and a tip end of each of the electrodes is located on a tip end side of each of the protecting tubes over the bent portion.

According to another aspect of the present invention, there is provided a substrate processing apparatus, including: a processing tube; a support section to support a plurality of substrates in such a way that the substrate are vertically stacked in the processing tube; a gas supply system to supply processing gas into the processing tube; an exhaust system to exhaust an atmosphere from the processing tube; at least a pair of electrodes made of flexible member extending in a stacking direction of the substrates; and protecting tubes disposed inside the processing tube to accommodate the electrodes therein, wherein each of the protecting tubes is provided with a bent portion at a higher position than an uppermost substrate supported by the support section, and a tip end of each of the electrodes extends to a tip end side of each of the protecting tubes along the bent portion.

BRIEF DESCRIPTION OF DRAWINGS

FIG. 10 is a schematic transverse sectional view for explaining a vertical type substrate processing furnace of a conventional substrate processing apparatus;

FIG. 11 is a partially enlarged vertical sectional view taken along the line C-C in FIG. 10;

FIG. 12 is a schematic vertical sectional view for explaining conventional electrodes for generating plasma;

FIG. 13 is a schematic vertical sectional view for explaining conventional electrodes for generating plasma; and FIG. 14 is a schematic vertical sectional view for explaining conventional electrodes for generating plasma.

DESCRIPTION OF THE PREFERRED EMBODIMENTS

Next, preferred embodiments of the present invention will be explained.

A vertical batch type semiconductor producing apparatus in the preferred embodiments of the present invention generates plasma to form a film on a wafer using braided electrodes accommodated in protecting tubes welded to an inner wall of a processing tube. Since each of the protecting tubes has at least one bent portion, friction between the inner wall of the protecting tube and the electrodes prevents the electrodes from being varied in shape.

Next, the preferred embodiments of the present invention will be explained in more detail with reference to the drawings.

In the embodiments, a film forming processing using an ALD (Atomic Layer Deposition) method as an example of processing on a substrate such as a wafer will be briefly explained.

According to the ALD method, two (or more) kinds of gases which are materials to be used for film formation are alternately supplied onto substrates one kind by one kind under given film forming conditions (temperature, time, etc.), the gases are adsorbed onto the substrates on an atom-layer basis to form films utilizing surface reaction.

For example, if a SiN (silicon nitride) film is formed by the ALD method, a high quality film can be formed at low temperature in a range of 300 to 600° C. using DCS ($SiH_2Cl_2$, dichlorosilane) and $NH_3$ (ammonia). A plurality of kinds of reaction gases as material gases required for film formation are alternately supplied one kind by one kind. The film thickness is controlled by the number of cycles of supply of the reaction gases (if a film forming speed is 1 Å/cycle, 20 cycles are carried out when a film of 20 Å is formed).

Figure 1:
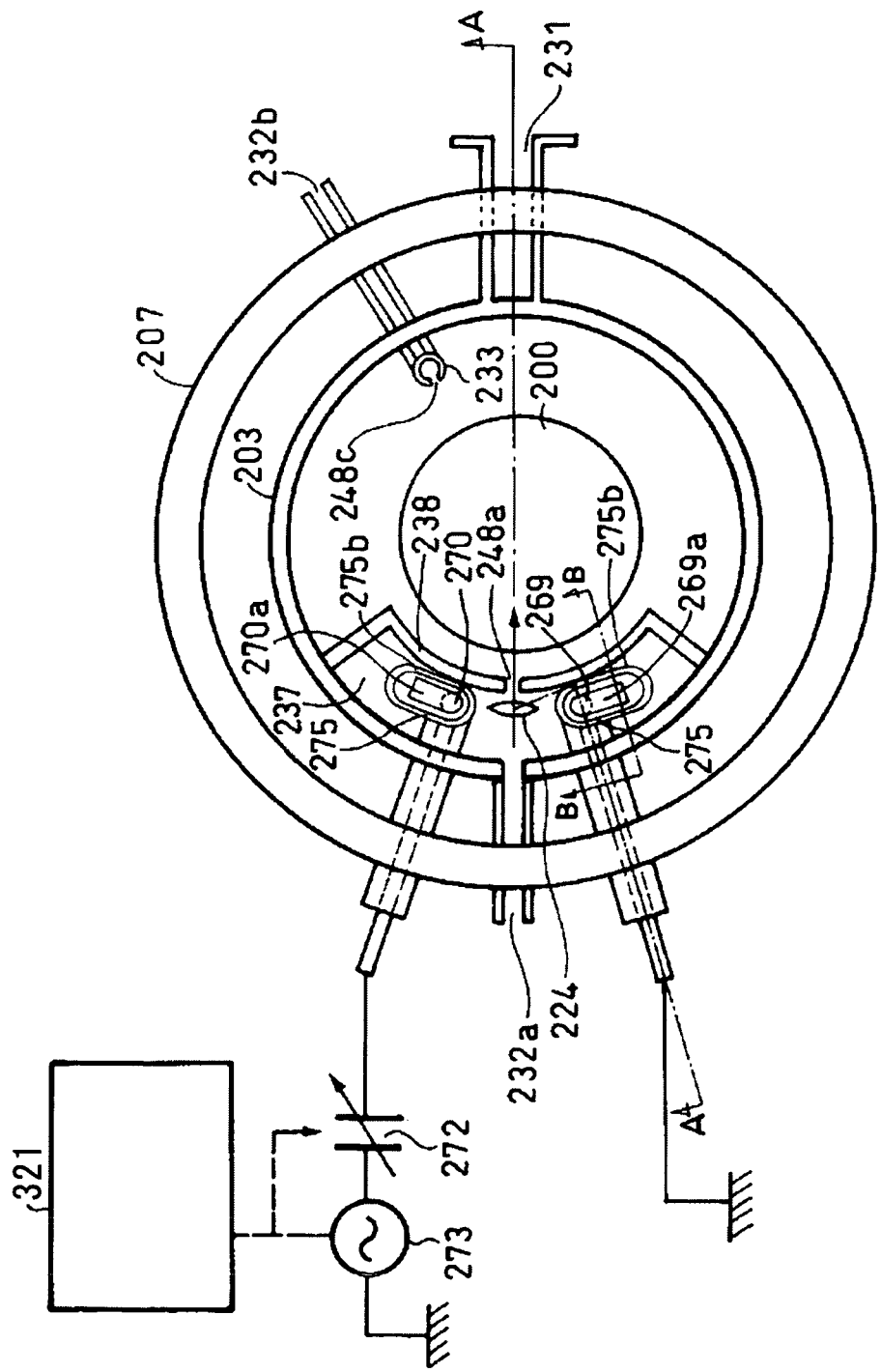
FIG. 1 is a schematic transverse sectional view for explaining a vertical type substrate processing furnace of a substrate processing apparatus according to preferred embodiments of the present invention.
Figure 2:
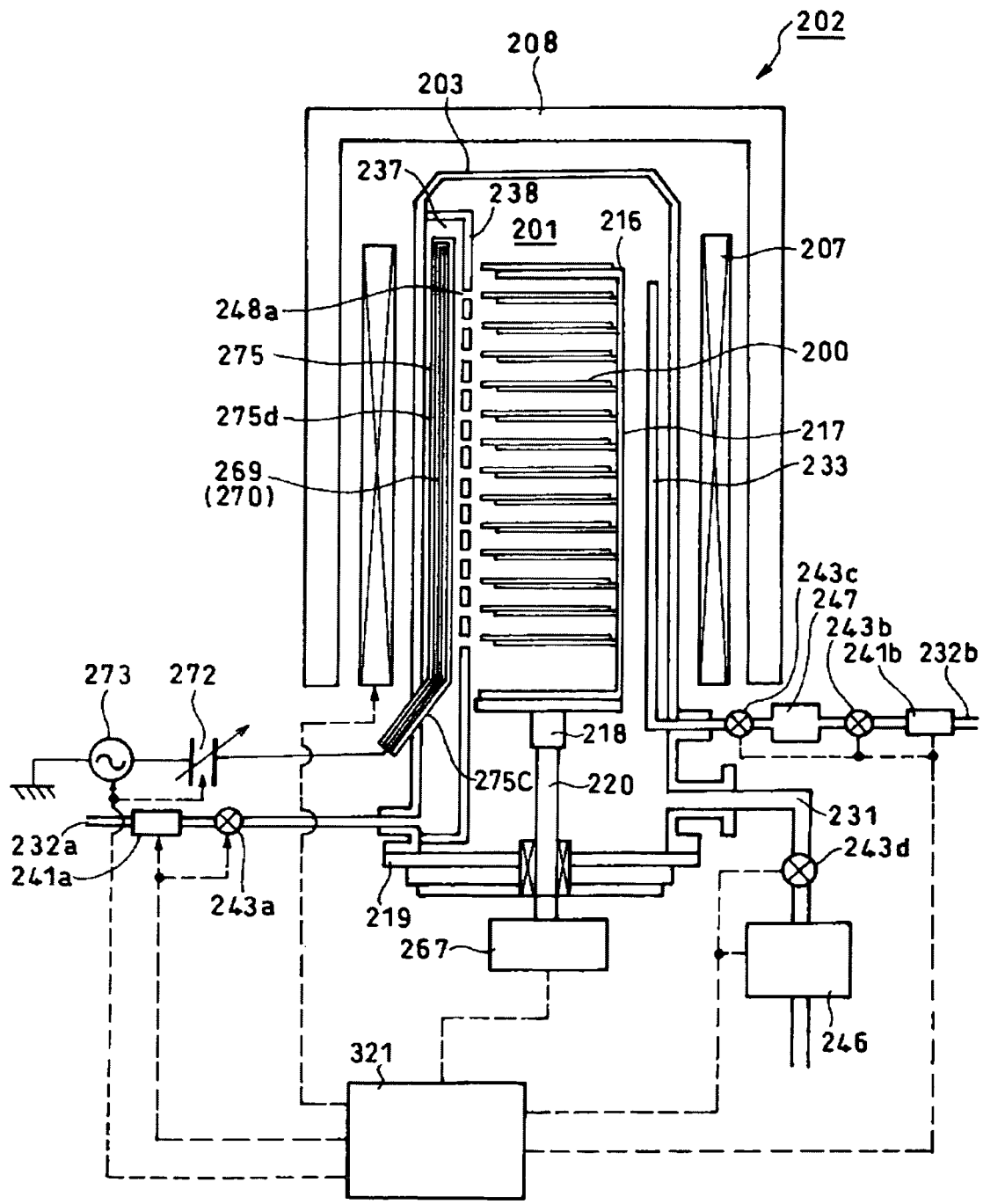
FIG. 2 is a vertical sectional view taken along the line A-A in FIG. 1.
Figure 3:
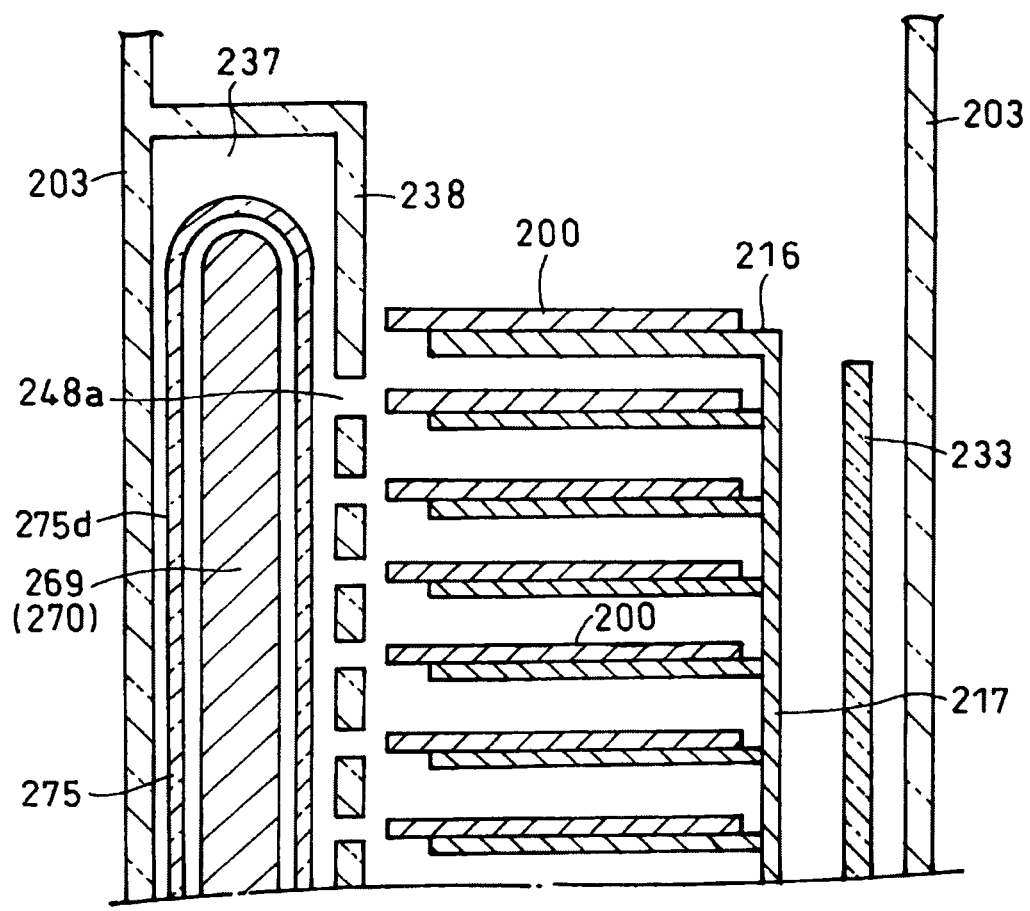
FIG. 3 is a partially enlarged vertical sectional view of FIG. 2.
Figure 4:
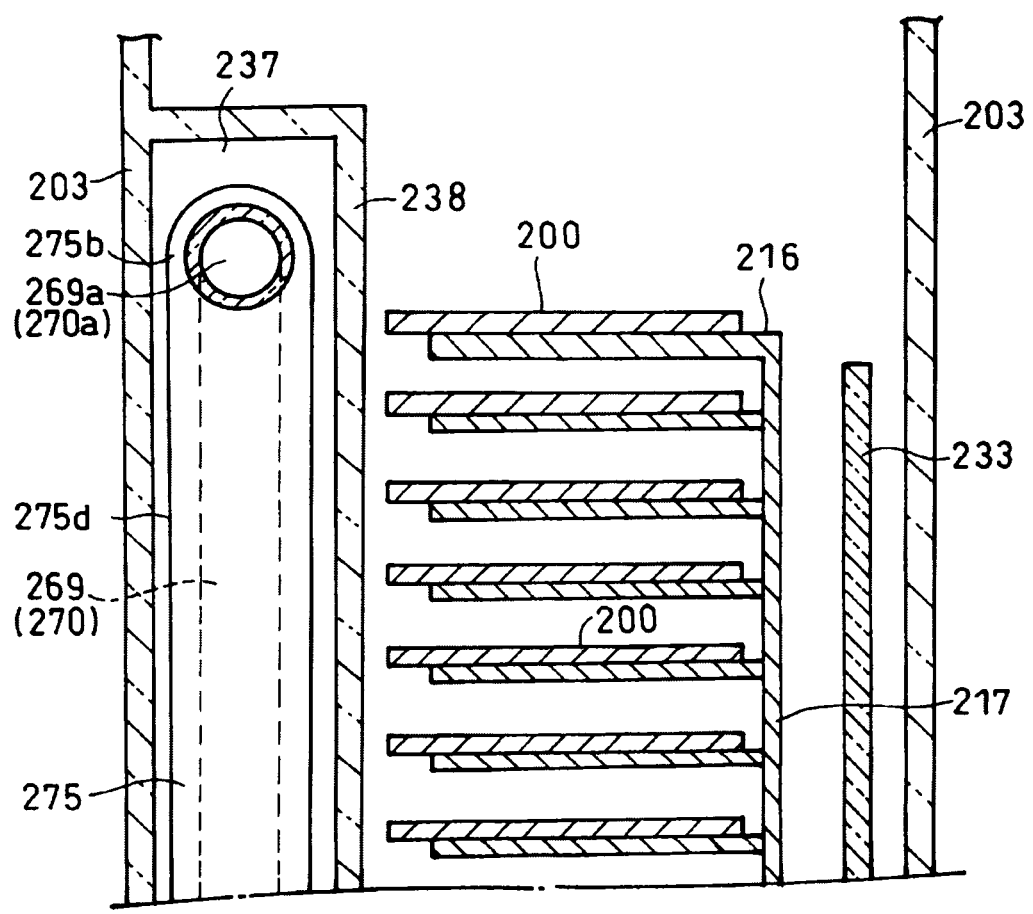
FIG. 4 is a partially enlarged vertical sectional view taken along the line B-B in FIG. 1.
Figure 5:
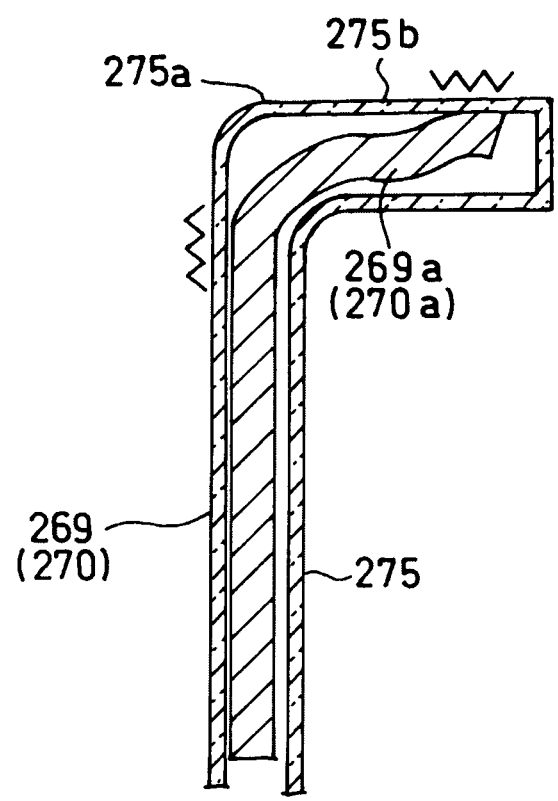
FIG. 5 is a schematic vertical sectional view for explaining electrodes for generating plasma and an electrode protecting tube which are used in the substrate processing apparatus according to the preferred embodiments of the present invention.
Figure 6:
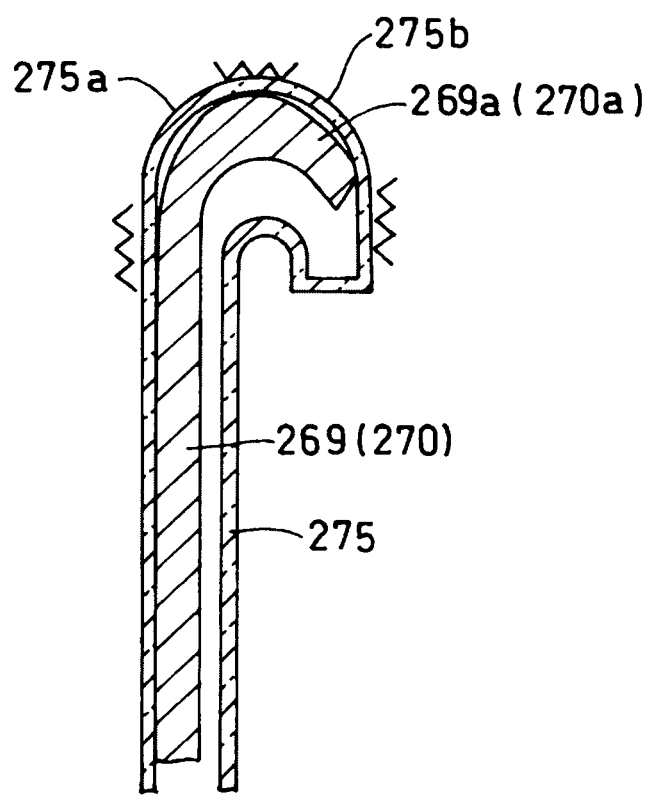
FIG. 6 is a schematic vertical sectional view for explaining electrodes for generating plasma and an electrode protecting tube which are used in the substrate processing apparatus according to the preferred embodiments of the present invention.

FIG. 1 is a schematic transverse sectional view for explaining a vertical type substrate processing furnace of a substrate processing apparatus according to preferred embodiments of the present invention. FIG. 2 is a vertical sectional view taken along the line A-A in FIG. 1. FIG. 3 is a partially enlarged vertical sectional view of FIG. 2. FIG. 4 is a partially enlarged vertical sectional view taken along the line B-B in FIG. 1. FIGS. 5 and 6 are schematic vertical sectional views for explaining electrodes for generating plasma and an electrode protecting tube which are used in the substrate processing apparatus according to the preferred embodiments of the present invention.

A processing tube 203 as a reaction container which processes wafers 200 as substrates is provided inside a heater 207 which is heating means. A lower end opening of the processing tube 203 is air-tightly closed by a seal cap 219 as a lid through an O-ring (not shown) which is an air-tight member. A heat insulating member 208 is provided outside the processing tube 203 and the heater 207. The heat insulating member 208 covers an upper part of the processing tube 203. At least the heater 207, the heat insulating member 208, the processing tube 203 and the seal cap 219 constitute a processing furnace 202. The processing tube 203, the seal cap 219 and a later-described buffer chamber 237 formed in the processing tube 203 constitute a processing chamber 201. A boat 217 which is substrate holding means stands on the seal cap 219 through a boat stage 218 and a rotational axis 220. The boat stage 218 is a holding body which holds the boat 217. The boat 217 is inserted into the processing furnace 202. A plurality of wafers 200 which are to be subjected to batch process are stacked on the boat 217 in a horizontal attitude in multi-layers in the axial direction of the tube. The heater 207 heats the wafers 200 inserted into the processing furnace 202 to a predetermined temperature.

The boat 217 is provided at a central portion in the processing tube 203. A plurality of wafers 200 are placed on the boat 217 at a constant distance from one another in multi-layers. The boat 217 can be loaded into and unloaded from the processing tube 203 by a boat elevator mechanism (not shown). A boat rotation mechanism 267 which is rotating means for rotating the boat 217 is provided to enhance the uniformity of the processing. The boat 217 supported by the boat stage 218 is rotated by driving the boat rotation mechanism 267.

Two gas supply tubes 232a and 232b are provided as supply tubes through which a plurality of (two, in this embodiment) kinds of gases are supplied to the processing furnace 202. Here, a reaction gas is supplied from the gas supply tube 232a to the processing chamber 201 through a mass flow controller 241a which is flow rate control means, a valve 243a which is an on-off valve, and a later-described buffer chamber 237 formed in the reaction tube 203. A reaction gas is supplied from the gas supply tube 232b to the processing chamber 201 through a mass flow controller 241b which is flow rate control means, a valve 243b which is an on-off valve, a gas tank 247, a valve 243c which is an on-off valve and a gas supply section (not shown).

The processing chamber 201 is connected to a vacuum pump 246 which is exhaust means through a valve 243d by means of a gas exhaust pipe 231 for exhausting gas. The valve 243d is an on-off valve which can be opened and closed so that the processing chamber 201 can be evacuated and the evacuation can be stopped. A pressure in the processing chamber 201 can be adjusted by adjusting the opening of the valve 243d.

The buffer chamber 237 which is a gas dispersion space is provided in an arc space between the wafers 200 and an inner wall of the processing tube 203 constituting the processing chamber 201 along a stacking direction of the wafers 200 and along the inner wall of the processing tube 203 from its lower portion to its upper portion. Gas supply holes 248a which are supply holes through which gas is supplied toward the processing tube 203 are formed in a central portion of an inner wall 238 of the buffer chamber 237 which is adjacent to the wafers 200. The gas supply holes 248a are opened toward the center of the processing tube 203. The gas supply holes 248a have the same opening areas from a lower portion to an upper portion along the stacking direction of the wafers 200 over a predetermined length, and the gas supply holes 248a have the opening pitches.

A gas supply pipe 232a is connected to a sidewall of the processing tube 203 on the opposite side from the gas supply holes 248a of the buffer chamber 237.

Electrodes 269 and 270 having thin and long structures are protected by electrode protecting tubes 275 which are protecting tubes for protecting the electrodes from their upper portions to lower portions and disposed in the buffer chamber 237. One of the electrodes 269 and 270 is connected to a high frequency power supply 273 through a matching device 272, and the other is grounded having reference potential. As a result, plasma is generated in a plasma-generating region 224 between the electrode 269 and the electrode 270.

High frequency power is applied to the two thin and long juxtaposed electrodes 269 and 270 to generate plasma, and with the plasma, an active species is generated. The active species passing through the gas supply holes 248a together with other gas particles is supplied to the wafers 200. To suppress an outflow of charged particles produced by the plasma from the gas supply holes 248a, structure of the buffer chamber 237, sizes, positions and the number of gas supply holes 248a are optimized in accordance with purpose of the processing. In this embodiment, positions of the gas supply holes 248a correspond to locations between the wafers 200. Since the plasma generating space is limited in the buffer chamber 237 in which plasma is generated, it is possible to suppress dispersion of charged particles produced by plasma, and to reduce damage of wafers 200 due to ions.

The electrode protecting tubes 275 have such a structure that the electrodes 269 and 270 can be inserted in the buffer chamber 237 in such a way that the electrodes 269 and 270 are isolated from an atmosphere in the buffer chamber 237.

If an atmosphere in the electrode protecting tubes 275 is the same as outside air (atmosphere), the electrodes 269 and 270 inserted into the electrode protecting tubes 275 are oxidized due to heat by the heater 207. Hence, an inert gas purge mechanism (not shown) is provided so that the electrode protecting tubes 275 are charged and purged with an inert gas such as nitrogen in order to suppress the oxygen concentration sufficiently, thereby preventing the electrode 269 or electrode 270 from being oxidized.

The electrode protecting tubes 275 are provided with bent portions 275a at a higher position than an uppermost wafer 200 placed on a boat top section 216. Tip ends 269a and 270a of the electrodes 269 and 270 are located at tip ends 275b on tip end sides of the electrode protecting tubes 275 beyond the bent portions 275a.

Since the electrodes 267 and 270 extend to locations higher than the uppermost wafer 200, it is possible to prevent a case wherein plasma is not generated or plasma is unevenly generated in a region where a plurality of wafers 200 exist, and the wafers 200 can be processed evenly.

FIGS. 5 and 6 show preferable examples of the electrode protecting tube 275. In the upper region, the bent portion 275a has one or more curvatures. FIG. 5 shows an example in which one curvature is provided at an upper portion, and FIG. 6 shows an example in which two curvatures are provided. Because the curvature is provided so that the electrodes 269 and 270 cause friction with the inner walls of the electrode protecting tubes 275, it is possible to effectively prevent variation with time (deformation in vertical direction) especially due to their own weight.

A lower side of the electrode protecting tube 275 is also bent. The electrode protecting tube 275 includes a vertical portion 275d which straightly extends in the buffer chamber 237 from a lower side lower than a lowermost wafer 200 to an upper portion higher than the uppermost wafer 200 placed on the boat top board 216. The electrode protecting tube 275 also includes a bent portion 275a and a tip end portion 275b located higher than the vertical portion 275d, and an inclined portion 275c located lower than the vertical portion 275d. A lower end of the inclined portion 275c projects outward from a sidewall of the processing tube 203. A lower end of the inclined portion 275c is welded to the sidewall of the processing tube 203. Since the vertical portion 275d extends from the location lower than the lowermost wafer 200 and to the location higher than the uppermost wafer 200 placed on the boat top board 216, plasma can be generated evenly in a region where a plurality of wafers 200 exist and the wafers 200 can be processed evenly.

Because a flexible member is used as the electrodes 269 and 270, the electrodes 269 and 270 can be inserted into the electrode protecting tubes 275 from the lower ends of the inclined portions 275c of the electrode protecting tubes 275, and the electrodes 269 and 270 can reach the upper tip ends 275b of the electrode protecting tubes 275. The upper tip ends 275b of the electrodes 269 and 270 are closed.

Figure 7:
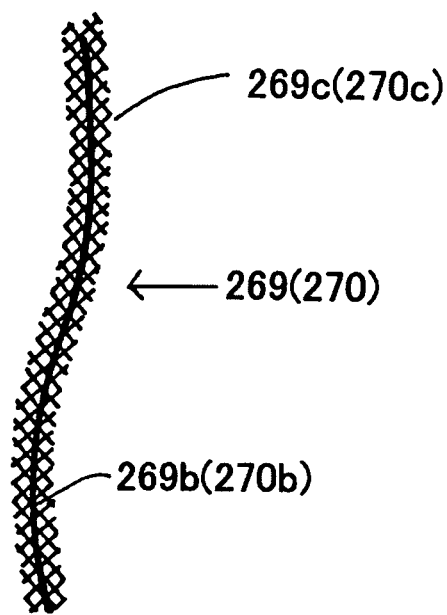
FIG. 7 is a schematic diagram for explaining the electrodes for generating plasma which are used in the substrate processing apparatus according to the preferred embodiments of the present invention.

With reference to FIG. 7, the plasma radiation electrodes 269 and 270 have such a structure that cores 269b and 270b are incorporated into braided electrodes 269c and 270c, respectively. The cores 269b and 270b are made of the same material as that of the braided electrodes 269c and 270c. In this embodiment, alloy having Ni as main ingredient is used in terms of heat resistance.

In order to insert the plasma radiation electrodes 269 and 270 into the electrode protecting tubes 275, the cores 269b and 270b should have such rigidity that they can appropriately be curved and thickness corresponding to the rigidity. Since the braided electrodes 269c and 270c are employed, the plasma radiation electrodes 269 and 270 can be bent. Since the cores 269b and 270b are incorporated in the electrodes, it is possible to prevent the plasma radiation electrodes 269 and 270 from extending and contracting, and it is possible to further suppress the vertical deformation of the electrodes. Further, it is possible to maintain the bending function, and the variation with time can be reduced.

A nozzle 233 is provided inside the processing tube 203 at a location turned from the gas supply holes 248a by about 120°. The nozzle 233 is a supply portion which shares kinds of supply gases with the buffer chamber 237 when a plurality of kinds of gases are alternately supplied onto the wafers 200 one kind by one kind for forming films by the ALD method.

Like the buffer chamber 237, the nozzle 233 also has gas supply holes 248c which are supply holes through which gas is supplied. The gas supply holes 248c are formed at locations adjacent to the wafers at equal distances from one another. A gas supply pipe 232b is connected to a lower portion.

When a difference in pressure between the nozzle 233 and the processing chamber 201 is small, the opening areas of the gas supply holes 248c should be equal to each other from upstream side to downstream side, and the opening pitch should be the same. When this pressure difference is great, on the contrary, the opening areas are increased or the distances between the holes should be reduced from the upstream side to the downstream side.

A controller 321 which is control means is connected to mass-flow controllers 241a and 241b, valves 243a, 243b, 243c and 243d, the heater 207, a vacuum pump 246, a boat rotating mechanism 267, a boat elevator mechanism (not shown), a high frequency power supply 273 and the matching device 272. The controller 321 adjusts flow rates of the mass-flow controllers 241a and 241b, controls opening and closing motion of the valves 243a, 243b and 243c, controls opening and closing motion and adjusts pressure of the valve 243d, adjusts the temperature of the heater 207, starts and stops the vacuum pump 246, adjusts rotation speed of the boat rotating mechanism 267, controls vertical movement of the boat elevator mechanism, control of electricity supply of the high frequency power supply 273, and controls impedance by the matching device 272.

Next, a SiN film formation using DCS and $NH_3$ gases will be explained as an example of film formation by the ALD method.

First, the boat 217 is charged with wafers 200 for film formation and is loaded into the processing furnace 202. After the loading, the following four steps are executed sequentially.

[Step 1]

In step 1, $NH_3$ gas which needs plasma excitation and DCS gas which does not need plasma excitation flow in parallel. First, the valve 243a provided in the gas supply pipe 232a and the valve 243d provided in the gas exhaust pipe 231 are both opened, $NH_3$ gas whose flow rate is adjusted by the mass-flow controller 241a issues from the gas supply pipe 232a into the buffer chamber 237, 0.1 to 0.6 kW high frequency electricity is applied between the electrode 269 and the electrode 270 from the high frequency power supply 273 through the matching device 272 to plasma excite $NH_3$, the $NH_3$ is supplied into the processing chamber 201 as active species, and the $NH_3$ is exhausted from the gas exhaust pipe 231. When the $NH_3$ gas is plasma-excited and the $NH_3$ gas flows as the active species, the valve 243d is appropriately adjusted, and the pressure in the processing chamber 201 is maintained within a range of 10 to 100 Pa. The supply flow rate of $NH_3$ controlled by the mass flow controller 241a is in a range of 1000 to 10000 sccm. Time during which the wafers 200 are exposed to the active species obtained by plasma-exciting $NH_3$ is in a range of 2 to 120 seconds. The temperature of the heater 207 at that time is set in a range of 300 to 600° C. If the $NH_3$ gas is plasma-activated, the wafer surface can be processed at a low temperature.

When $NH_3$ is plasma-excited and supplied as active species, the valve 243b located upstream of the gas supply pipe 232b is opened, the valve 243c located downstream is closed and DCS also flows. With this, DCS is stored in the gas tank 247 provided between the valves 243b and 243c. At that time, gas flowing into the processing chamber 201 is active species obtained by plasma-exciting $NH_3$, and DCS does not exist. Therefore, $NH_3$ is plasma-excited and becomes active species and surface-reacts with a foundation film on the wafer 200 without causing vapor-phase reaction.

[Step 2]

In step 2, the valve 243a of the gas supply pipe 232a is closed to stop the supply of $NH_3$, and the processing tube 203 is purged with an inert gas such as $N_2$. The supply to the gas tank 247 is continued during that time. If a predetermined amount of DCS at a predetermined pressure is stored in the gas tank 247, the upstream valve 243b is also closed, and DCS is trapped in the gas tank 247. The valve 243d of the gas exhaust pipe 231 is left open, gas is sufficiently exhausted from the processing chamber 201 by the vacuum pump 246, and remaining $NH_3$ is exhausted from the processing chamber 201.

[Step 3]

In step 3, if exhausting operation of the processing chamber 201 is completed, the valve 243d of the gas exhaust pipe 231 is closed to stop the exhausting operation. The valve 243c on a downstream side of the gas supply pipe 232b is opened. With this, DCS stored in the gas tank 247 is supplied into the processing chamber 201 at a dash. At that time, since the valve 243d of the gas exhaust pipe 231 is closed, the pressure in the processing chamber 201 abruptly increases and reaches to about 931 Pa (7 Torr). Time during which DCS is supplied is set to two to four seconds, and time during which the wafers are exposed to the increased pressure atmosphere thereafter is set to two to four seconds, and the total time is set to six seconds. The wafer temperature at that time is in a range of 300 to 600° C. like the case when $NH_3$ is supplied. By supplying DCS, DCS surface-reacts, Si substitutes for H of N—H coupling, and SiN films are formed on the wafers 200.

[Step 4]

In step 3, after the film formation, the valve 243c is closed and the valve 243d is opened to evacuate the processing chamber 201 and to eliminate remaining DCS gas after it contributed to the film formation. At that time, if an inert gas such as $N_2$ is supplied into the processing chamber 201, the effect for eliminating, from the processing chamber 201, remaining DCS gas after it contributed to film formation is further enhanced. The valve 243b is opened, and the supply of DCS to the gas tank 247 is started.

The above steps 1 to 4 are defined as one cycle, and this cycle is repeated a plurality of times, thereby forming the SiN films having predetermined thickness on the wafers.

In the ALD apparatus, gas is adsorbed on a foundation film surface. The absorption amount of gas is proportion to gas pressure and gas exposing time. Therefore, in order to absorb a desired given amount of gas within a short time, it is necessary to increase the gas pressure within a short time. In this embodiment, the valve 243d is closed and DCS stored in the gas tank 247 is instantaneously supplied. Therefore, it is possible to abruptly increase the pressure of DCS in the processing chamber 201, and to absorb a desired given amount of gas instantaneously.

In this embodiment, while DCS is stored in the gas tank 247, $NH_3$ gas is plasma-excited and supplied as the active species and exhausted from the processing chamber 201. This step is necessary in the ALD method. Therefore, a special step for storing DCS is not required. Further, gas is exhausted from the processing chamber 201, $NH_3$ gas is removed and then, DCS flows. Therefore, $NH_3$ gas and DCS do not react with each other on the way to the wafers 200. The supplied DCS can react effectively only with the surfaces of the wafers 200.

Figure 8:
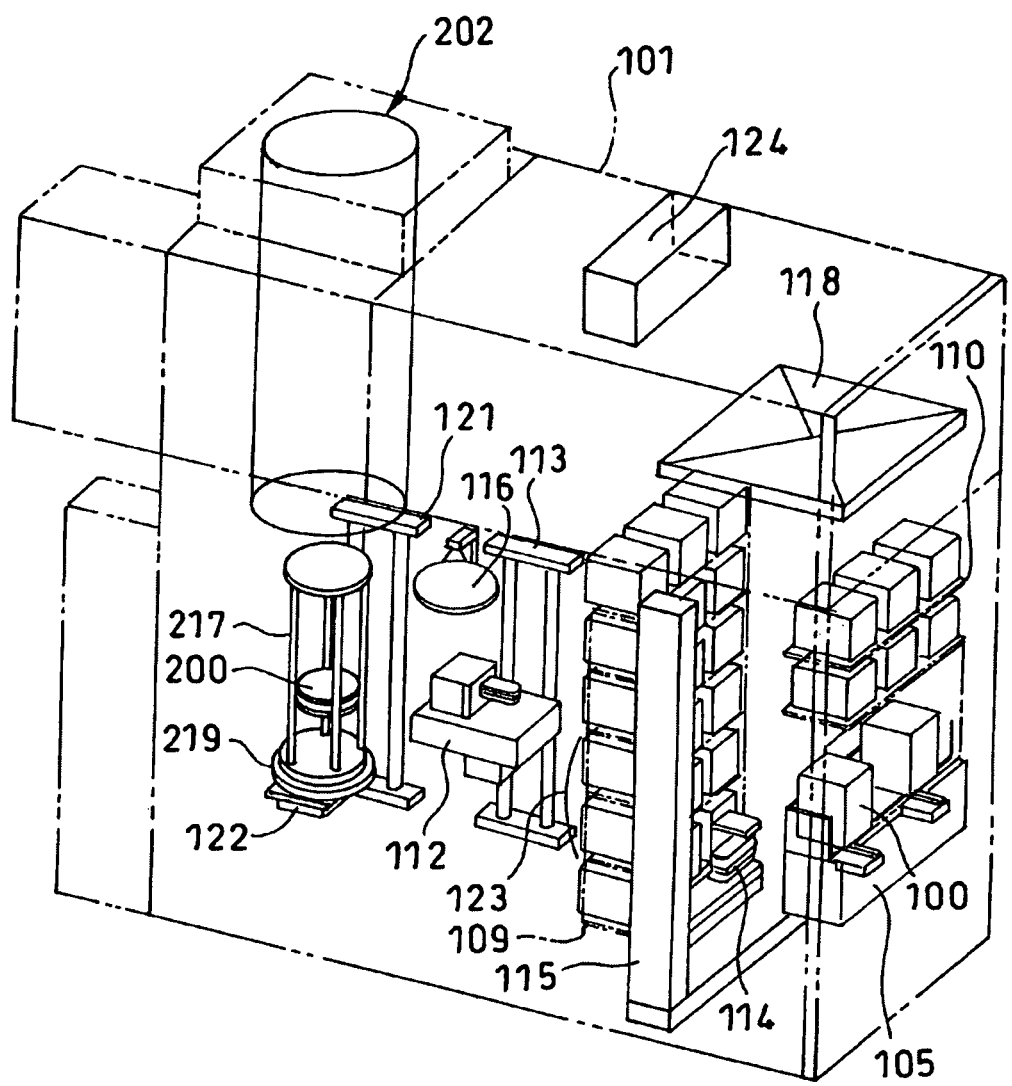
FIG. 8 is a schematic perspective view for explaining the substrate processing apparatus of the preferred embodiments of the present invention.
Figure 9:
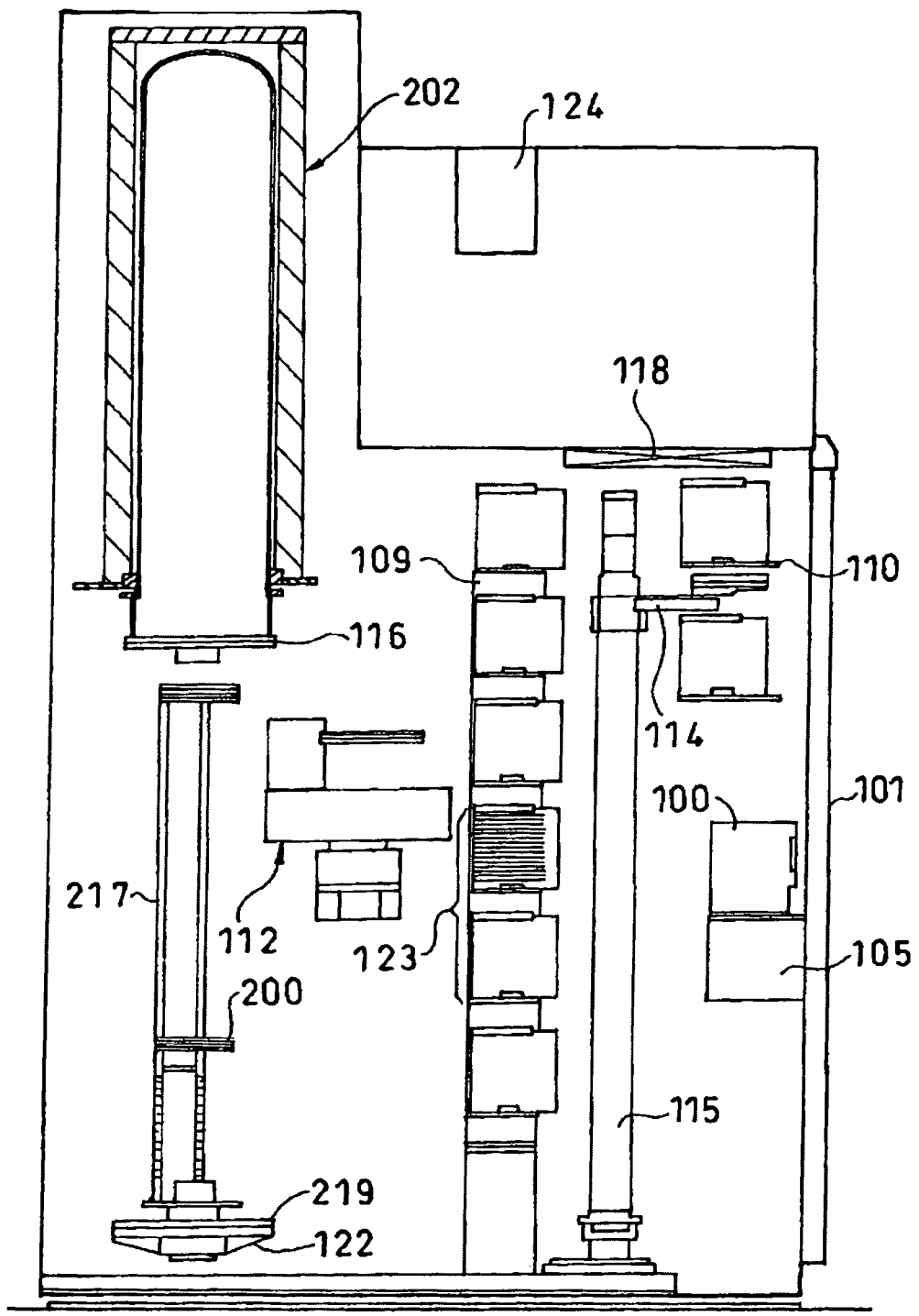
FIG. 9 is a schematic vertical sectional view for explaining the substrate processing apparatus of the preferred embodiments of the present invention.

Next, an outline of a semiconductor producing apparatus as an example of a substrate processing apparatus which is suitably applied to the present invention will be explained with reference to FIGS. 8 and 9.

A cassette stage 105 as a holder delivery member for transferring cassettes 100 as an accommodation container to and from an external transfer device (not shown) is provided in a casing 101 on the front surface side. A cassette elevator 115 as elevator means is provided behind the cassette stage 105. A cassette moving machine 114 as transfer means is mounted on the cassette elevator 115. Cassette shelves 109 as mounting means of the cassettes 100 are provided behind the cassette elevator 115. Auxiliary cassette shelves 110 are provided above the cassette stage 105. A clean unit 118 is provided above the auxiliary cassette shelves 110 so that clean air flows through the casing 101.

The processing furnace 202 is provided above a rear portion of the casing 101. A boat elevator 121 as elevator means is provided below the processing furnace 202. The boat elevator 121 vertically moves the boat 217 as substrate holding means which hold wafers 200 as substrates in horizontal attitude in multistage manner. The seal cap 219 as a lid is mounted on a tip end of an elevator member 122 mounted on the boat elevator 121, and the seal cap 219 vertically supports the boat 217. A transfer elevator 113 as elevator means is provided between the boat elevator 121 and the cassette shelves 109. A wafer moving machine 112 as transfer means is mounted on the transfer elevator 113. A furnace opening shutter 116 as closing means for air-tightly closing a lower side of the processing furnace 202 is provided beside the boat elevator 121. The furnace opening shutter 116 has an opening/closing mechanism.

The cassettes 100 into which wafers 200 are loaded are carried onto the cassette stage 105 from the external transfer device (not shown) in such an attitude that the wafers 200 are oriented upward, and the cassettes 100 are rotated 90 degrees on the cassette stage 105 such that the wafers 200 are in the horizontal attitudes. The cassettes 100 are transferred from the cassette stage 105 to the cassette shelves 109 or the auxiliary cassette shelves 110 in cooperation with vertical motion and lateral motion of the cassette elevator 115 and forward and backward motion and rotation of the cassette moving machine 114.

Transfer shelves 123 in which cassettes 100 to be transferred by the wafer moving machine 112 are included in the cassette shelves 109. The cassette 100, which contains the wafers 200 to be transferred, is transferred to the transfer shelves 123 by the cassette elevator 115 and the cassette moving machine 114.

When the cassette 100 is transferred to the transfer shelves 123, the wafers 200 are transferred to the boat 217, which is in the lowered state, from the transfer shelves 123 in cooperation with forward and backward motion and rotation of the wafer moving machine 112 and vertical motion of the transfer elevator 113.

When a predetermined number of wafers 200 are transferred to the boat 217, the boat 217 is inserted into the processing furnace 202 by the boat elevator 121, and the processing furnace 202 is air-tightly closed by the seal cap 219. The wafers 200 are heated in the air-tightly closed processing furnace 202, processing gas is supplied into the processing furnace 202 and the wafers 200 are processed.

When the processing of the wafers 200 is completed, the wafers 200 are transferred to the cassettes 100 on the transfer shelves 123 from the boat 217 in the reverse procedure to the above-described procedure, the cassettes 100 are transferred from the transfer shelves 123 to the cassette stage 105 by the cassette moving machine 114, and are transferred out from the casing 101 by the external transfer device (not shown). When the boat 217 is lowered, the furnace opening shutter 116 air-tightly closes the lower surface of the processing furnace 202 so as to prevent outside air from being mixed into the processing furnace 202.

The transfer operation of the cassette moving machine 114 is controlled by transfer operation control means 124.

As described above, according to the preferred embodiments of the present invention, there is provided a substrate processing apparatus, including: a processing chamber to accommodate a plurality of substrates therein in such a way that the substrate are vertically stacked; a gas supply system to supply processing gas into the processing chamber; an exhaust system to exhaust an atmosphere from the processing chamber; at least a pair of electrodes made of flexible member extending in a stacking direction of the substrates to activate the processing gas; and protecting tubes to accommodate the electrodes therein, wherein each of the protecting tubes is provided with a bent portion at a higher position than an uppermost substrate, and a tip end of each of the electrodes is located on a tip end side of each of the protecting tubes over the bent portion.

According to the preferred embodiments of the present invention, there is provided a substrate processing apparatus having electrodes which extend in a stacking direction of vertically stacked substrates and which are made of flexible member, the substrate processing apparatus being capable of reducing vertical deformation of the electrodes.

Preferably, the bent portion of each of the protecting tubes has one curvature portion, and each of the electrodes extends to the tip end side of each of the protecting tubes along the curvature portion.

Preferably, the bent portion of each of the protecting tubes has a plurality of curvature portions, and each of the electrodes extends to the tip end side of each of the protecting tubes along the plurality of curvature portions. For example, the bent portion of each of the protecting tubes has two curvature portions, and each of the electrodes extends to the tip end side of each of the protecting tubes along the two curvature portions.

Preferably, each of the protecting tubes includes a tip end and a lower end, the tip end is a closed end, and the lower end is an end for inserting each of the electrodes.

Preferably, each of the electrodes has such a structure that at least a center core is incorporated inside a braided electrode.

According to another preferred embodiments of the present invention, there is provided a substrate processing apparatus, including: a processing tube; a support section to support a plurality of substrates in such a way that the substrate are vertically stacked in the processing tube; a gas supply system to supply processing gas into the processing tube; an exhaust system to exhaust an atmosphere from the processing tube; at least a pair of electrodes made of flexible member extending in a stacking direction of the substrates; and protecting tubes disposed inside the processing tube to accommodate the electrodes therein, wherein each of the protecting tubes is provided with a bent portion at a higher position than an uppermost substrate supported by the support section, and a tip end of each of the electrodes extends to a tip end side of each of the protecting tubes along the bent portion.

The entire disclosures of Japanese Patent Application No. 2006-127869 filed on May 1, 2006 including specification, claims, drawings and abstract are incorporated herein by reference in its entirety.

Although various exemplary embodiments have been shown and described, the invention is not limited to the embodiments shown. Therefore, the scope of the invention is intended to be limited solely by the scope of the claims that follow.

As described above, according to the preferred embodiments of the present invention, with respect to a substrate processing apparatus having electrodes which extend in a stacking direction of vertically stacked substrates and which are made of flexible member, it is possible to reduce vertical deformation of the electrodes.

As a result, the present invention can suitably be utilized for a substrate processing apparatus which forms a film on a semiconductor wafer using plasma-excited processing gas.

What is claimed is:

1. A substrate processing apparatus, comprising:
   a processing chamber to accommodate a plurality of substrates therein in such a way that the substrate are vertically stacked;
   a gas supply system to supply processing gas into the processing chamber;
   an exhaust system to exhaust an atmosphere from the processing chamber;
   at least a pair of electrodes made of flexible member extending in a stacking direction of the substrates to activate the processing gas; and
   protecting tubes to accommodate the electrodes therein, wherein
   each of the protecting tubes is provided with a bent portion at a higher position than an uppermost substrate, and a tip end of each of the electrodes is located on a tip end side of each of the protecting tubes over the bent portion.

2. The substrate processing apparatus according to claim 1, wherein
   the bent portion of each of the protecting tubes has one curvature portion, and each of the electrodes extends to the tip end side of each of the protecting tubes along the curvature portion.

3. The substrate processing apparatus according to claim 1, wherein
   the bent portion of each of the protecting tubes has a plurality of curvature portions, and each of the electrodes extends to the tip end side of each of the protecting tubes along the plurality of curvature portions.

4. The substrate processing apparatus according to claim 3, wherein
the bent portion of each of the protecting tubes has two curvature portions, and each of the electrodes extends to the tip end side of each of the protecting tubes along the two curvature portions.

5. The substrate processing apparatus according to claim 1, wherein
each of the protecting tubes includes a tip end and a lower end, the tip end is a closed end, and the lower end is an end for inserting each of the electrodes.

6. The substrate processing apparatus according to claim 1, wherein
each of the electrodes has such a structure that at least a center core is incorporated inside a braided electrode.

7. A substrate processing apparatus, comprising:
a processing tube;
a support section to support a plurality of substrates in such a way that the substrate are vertically stacked in the processing tube;
a gas supply system to supply processing gas into the processing tube;
an exhaust system to exhaust an atmosphere from the processing tube;
at least a pair of electrodes made of flexible member extending in a stacking direction of the substrates; and
protecting tubes disposed inside the processing tube to accommodate the electrodes therein, wherein
each of the protecting tubes is provided with a bent portion at a higher position than an uppermost substrate supported by the support section, and a tip end of each of the electrodes extends to a tip end side of each of the protecting tubes along the bent portion.

8. The substrate processing apparatus according to claim 7, wherein each of the electrodes has such a structure that at least a center core is incorporated inside a braided electrode.

9. The substrate processing apparatus according to claim 6, wherein
the bent portion of each of the protecting tubes has one curvature portion, and each of the electrodes extends to the tip end side of each of the protecting tubes along the curvature portion.

10. The substrate processing apparatus according to claim 6, wherein
the bent portion of each of the protecting tubes has a plurality of curvature portions, and each of the electrodes extends to the tip end side of each of the protecting tubes along the plurality of curvature portions.

11. The substrate processing apparatus according to claim 10, wherein
the bent portion of each of the protecting tubes has two curvature portions, and each of the electrodes extends to the tip end side of each of the protecting tubes along the two curvature portions.

12. The substrate processing apparatus according to claim 6, wherein
each of the protecting tubes includes a tip end and a lower end, the tip end is a closed end, and the lower end is an end for inserting each of the electrodes.

13. The substrate processing apparatus according to claim 8, wherein
the bent portion of each of the protecting tubes has one curvature portion, and each of the electrodes extends to the tip end side of each of the protecting tubes along the curvature portion.

14. The substrate processing apparatus according to claim 8, wherein
the bent portion of each of the protecting tubes has a plurality of curvature portions, and each of the electrodes extends to the tip end side of each of the protecting tubes along the plurality of curvature portions.

15. The substrate processing apparatus according to claim 14, wherein
the bent portion of each of the protecting tubes has two curvature portions, and each of the electrodes extends to the tip end side of each of the protecting tubes along the two curvature portions.

16. The substrate processing apparatus according to claim 8, wherein
each of the protecting tubes includes a tip end and a lower end, the tip end is a closed end, and the lower end is an end for inserting each of the electrodes.

* * * * *